(12) United States Patent
Akaike

(10) Patent No.: US 7,580,109 B2
(45) Date of Patent: Aug. 25, 2009

(54) SUBSTRATE SUPPORTING UNIT, AND SUBSTRATE TEMPERATURE CONTROL APPARATUS AND METHOD

(75) Inventor: Yutaka Akaike, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 269 days.

(21) Appl. No.: 11/447,045

(22) Filed: Jun. 6, 2006

(65) Prior Publication Data
US 2006/0274298 A1 Dec. 7, 2006

Related U.S. Application Data

(60) Provisional application No. 60/687,869, filed on Jun. 7, 2005.

(30) Foreign Application Priority Data

Jun. 6, 2005 (JP) ............................. 2005-166232

(51) Int. Cl.
G03B 27/52 (2006.01)
(52) U.S. Cl. .............................. 355/30; 355/53; 355/72; 165/80.4
(58) Field of Classification Search ................ 165/80.4, 165/80.2, 104; 355/72, 30, 53
See application file for complete search history.

(56) References Cited

U.S. PATENT DOCUMENTS 5,186,238 A 2/1993 del Puerto et al.

6,605,814 B1 * 8/2003 Tadika et al. .............. 250/492.2
2004/0084143 A1 * 5/2004 Ivanov et al. ........... 156/345.11
2005/0068736 A1 * 3/2005 Moroz et al. ................ 361/704

FOREIGN PATENT DOCUMENTS

JP 2536989 7/1996
WO WO 2005/006400 A2 1/2005

* cited by examiner

Primary Examiner—Diane I Lee
Assistant Examiner—Mesfin T Asfaw
(74) Attorney, Agent, or Firm—Oblon, Spivak, McClelland, Maier & Neustadt, P.C.

(57) ABSTRACT

A substrate supporting unit includes a supporter for supporting a substrate, and a temperature controller for controlling the supporter. The supporter includes liquid supply openings opened at a top surface of the supporter. A liquid is supplied between the substrate and the supporter through the liquid supply opening. Liquid discharge grooves are formed in the top surface of the supporter near the liquid supply openings, and the liquid between the substrate and the supporter is discharged through the liquid discharge grooves. Liquid discharge openings are opened in the liquid discharge grooves, and the liquid is discharged through the liquid discharge openings. Further, the supporter includes exhaust grooves formed in the top surface of the supporter and exhaust openings opened in the exhaust grooves, the exhaust grooves and the exhaust openings also serving as the liquid discharge grooves and the liquid discharge openings, respectively.

15 Claims, 5 Drawing Sheets

SUBSTRATE SUPPORTING UNIT, AND SUBSTRATE TEMPERATURE CONTROL APPARATUS AND METHOD

FIELD OF THE INVENTION

The present invention relates to a substrate supporting unit, and an apparatus and a method for controlling a temperature of a substrate; and more particularly, to a substrate supporting unit, and an apparatus and a method for controlling a temperature of a substrate, wherein a liquid is supplied between the substrate and a supporter therefor to be used as a heat transfer medium, so that the temperature of the substrate can be promptly controlled.

BACKGROUND OF THE INVENTION

A semiconductor manufacturing process includes a plurality of processes, wherein a substrate supporting unit for supporting a substrate is used in processing the substrate at each process. Depending on the processing types, the substrate needs to be cooled or heated. At this time, the substrate is vacuum-adsorbed to be held on the substrate supporting unit. Since the substrate and the top surface of the substrate supporting unit are normally mirror-likely finished, the substrate is closely adhered on the top surface of the substrate supporting unit by the vacuum-adsorption, so that the temperature of the substrate can be promptly set to a predetermined level.

However, the substrate generates a large amount of heat in some processes. For example, the substrate generates a large amount of heat during, e.g., an inspection process for inspecting electric characteristics of a highly densely integrated circuit of the substrate. In this case, the substrate may not be sufficiently cooled by the substrate supporting unit. This is believed to be caused by the presence of microscopically formed fine voids due to micron-order irregularities on the substrate and the substrate supporting unit even though they are mirror-likely finished and the voids are depressurized by the vacuum adsorption to increase a contact thermal resistance.

Accordingly, there has been proposed in Japanese Patent Publication No. H8-17200 (Reference 1) and Japanese Patent No. 2536989 (Reference 2) a technology in which a liquid is supplied between the substrate and the substrate supporting unit so as to eliminate the voids therebetween to increase the cooling efficiency by using the liquid as a heat transfer medium.

In Reference 1, there is disclosed a substrate cooling system including a chuck for supporting a substrate, a source vessel for providing a liquid interface between the substrate and the chuck, and a collection vessel for collecting the liquid from the liquid interface. The top surface of the chuck has spiral grooves as a cooling circuit of a dense pitch, and an inlet and an outlet are respectively formed at both ends of the spiral grooves. The spiral grooves include three types of grooves adapted to be separately used depending on, e.g., the size of the substrate. The source vessel maintained at atmospheric pressure is connected to the inlet and the collection vessel maintained at a lower pressure than the atmospheric pressure is connected to the outlet. Further, a vacuum sealing groove is formed in the top surface of the chuck and a seal around the substrate is provided through the vacuum sealing groove. The vacuum sealing groove is configured to adsorb a peripheral portion of the substrate depending on the kinds of the substrate.

When the substrate is cooled by using the substrate cooling system, the substrate is first mounted on the chuck and is then adsorbed through the vacuum sealing groove to seal the inner side of the substrate. Subsequently, due to a pressure difference between the source vessel at the atmospheric pressure and the collection vessel at the sub-atmospheric pressure, a liquid is fed from the source vessel through the inlet into the spiral grooves and is then collected from the grooves through the outlet into the collection vessel. At this time, the liquid flows from the inlet to the outlet due to the pressure difference therebetween and, at the same time, the liquid flows across the spiral grooves due to a capillary action at the interface between the substrate and the chuck. Owing to such two actions, the entire surface of the substrate becomes wet and the liquid serves as a heat transfer medium, so that the cooling efficiency of the substrate by the chuck can be increased. Reference 2 also discloses a same technology as that in Reference 1.

In the disclosures of References 1 and 2, however, the liquid is fed from one end of the spiral grooves formed densely in the top surface of the chuck to be discharged through the other end thereof and the liquid moves across the grooves along the interface between the substrate and the chuck due to the capillary action, so that the liquid moves slowly, thus making it difficult to promptly control the temperature of the substrate.

SUMMARY OF THE INVENTION

It is, therefore, an object of the present invention to provide a substrate supporting unit, and a substrate temperature control apparatus and method capable of allowing the liquid to move fast at the interface between the substrate and the substrate supporting unit, thereby promptly controlling the temperature of the substrate.

In accordance with an aspect of the invention, there is provided a substrate supporting unit including: a supporter for supporting a substrate; and a temperature controller for controlling the supporter, wherein the supporter includes: at least one liquid supply opening opened at a top surface of the supporter, liquid being supplied between the substrate and the supporter through the liquid supply opening; at least one liquid discharge groove formed in the top surface of the supporter near the liquid supply opening, the liquid between the substrate and the supporter being discharged through the liquid discharge groove; and at least one liquid discharge opening opened in the liquid discharge groove, the liquid being discharged through the liquid discharge opening.

Preferably, the supporter further includes at least one exhaust groove, formed in the top surface of the supporter, for adsorbing the substrate onto the top surface of the supporter; and at least one exhaust opening opened in the exhaust groove, the exhaust groove and the exhaust opening also serving as the liquid discharge groove and the liquid discharge opening, respectively.

Preferably, the liquid supply opening is formed at a location other than the liquid discharge groove.

Preferably, the supporter further includes a passageway through which the liquid flows.

Preferably, the supporter further includes another passageway through which heat transfer medium for controlling temperature of the supporter flows.

In accordance with another aspect of the invention, there is provided a substrate temperature control apparatus for controlling temperature of a substrate supported on a supporter, including: the supporter including at least one liquid supply opening opened at a top surface of the supporter, liquid being supplied between the substrate and the supporter through the liquid supply opening; at least one liquid discharge groove formed in the top surface of the supporter near the liquid supply opening, the liquid between the substrate and the supporter being discharged through the liquid discharge groove; and at least one liquid discharge opening opened in the liquid discharge groove, the liquid being discharged through the liquid discharge opening; a liquid tank for containing the liquid, the liquid tank being connected to the liquid supply opening; and a liquid collection tank for collecting the liquid, the liquid collection tank being connected to the liquid discharge opening, wherein the liquid existing between the substrate and the supporter serves as a heat transfer medium therebetween.

In the substrate temperature control apparatus, preferably, the supporter further includes at least one exhaust groove, formed in the top surface of the supporter, for adsorbing the substrate onto the top surface of the supporter; and at least one exhaust opening opened in the exhaust groove, the exhaust groove and the exhaust opening also serving as the liquid discharge groove and the liquid discharge opening, respectively.

In the substrate temperature control apparatus, preferably, the liquid supply opening is formed at a location other than the liquid discharge groove.

In the substrate temperature control apparatus, preferably, the supporter further includes a passageway through which the liquid flows.

In the substrate temperature control apparatus, preferably, the supporter further includes another passageway through which heat transfer medium for controlling temperature of the supporter flows.

Preferably, the substrate temperature control apparatus further includes an openable/closable valve provided between the liquid collection tank and the liquid discharge opening, wherein the liquid tank supplies the liquid to the liquid supply opening and the liquid collection tank retrieves the liquid from the liquid discharge opening under a depressurized condition.

Preferably, the substrate temperature control apparatus further includes pressurizing units for pressurizing the liquid tank and the liquid collection tank, respectively.

Preferably, the substrate temperature control apparatus further includes a depressurizing unit for depressurizing the pressurized liquid collection tank.

In accordance with still another aspect of the invention, there is provided a substrate temperature control method for controlling temperature of a substrate supported on a supporter, including the steps of: controlling temperature of the supporter; mounting the substrate on the supporter; supplying liquid between the supporter and the substrate through at least one liquid supply opening opened at a top surface of the supporter; and discharging the liquid through at least one liquid discharge groove formed in the top surface of the supporter near the liquid supply opening from at least one liquid discharge opening opened in the liquid discharge groove by depressurizing the liquid discharge opening.

Preferably, the substrate temperature control method further includes the step of pressurizing a liquid tank when supplying the liquid from the liquid tank to the liquid supply opening.

Preferably, the substrate temperature control method further includes the steps of collecting the liquid in a liquid collection tank; and moving the liquid collected in the liquid collection tank to the liquid tank.

Preferably, the substrate temperature control method further includes the step of depressurizing the liquid collection tank after the liquid is moved from the liquid collection tank to the liquid tank.

Preferably, the substrate temperature control method further includes the step of removing the liquid between the supporter and the substrate before the substrate is removed from the supporter.

Preferably, the substrate temperature control method further includes the step of supplying gas between the substrate and the supporter when removing the liquid.

In accordance with the present invention, there are provided a substrate supporting unit, and a substrate temperature control apparatus and method capable of allowing the liquid to move fast at the interface between the substrate and the substrate supporting unit, thereby promptly controlling the temperature of the substrate.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
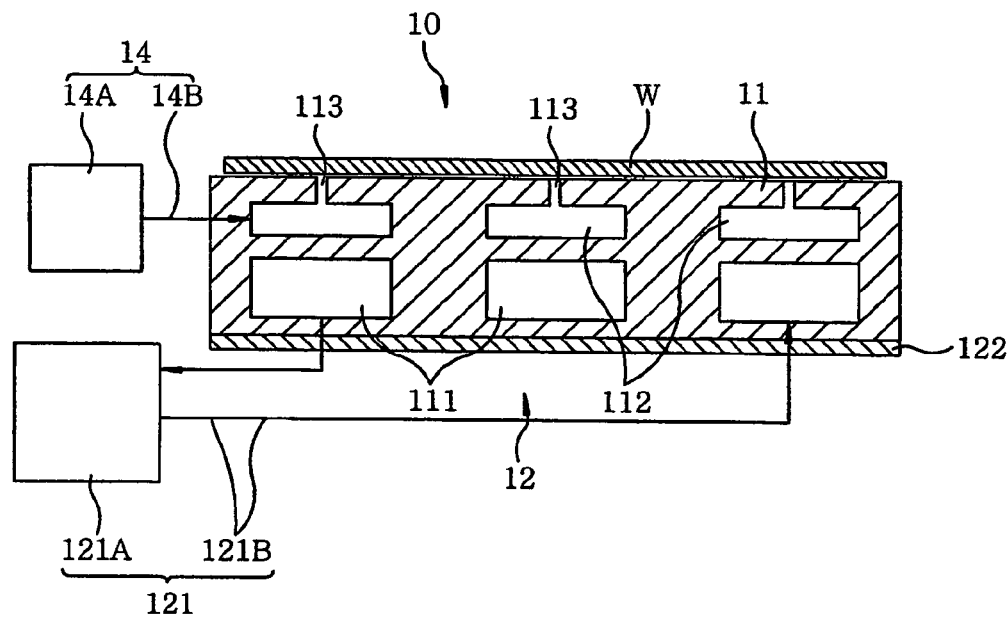
FIG. 1 is a conceptual view showing a substrate supporting unit in accordance with the present invention.
Figure 2:
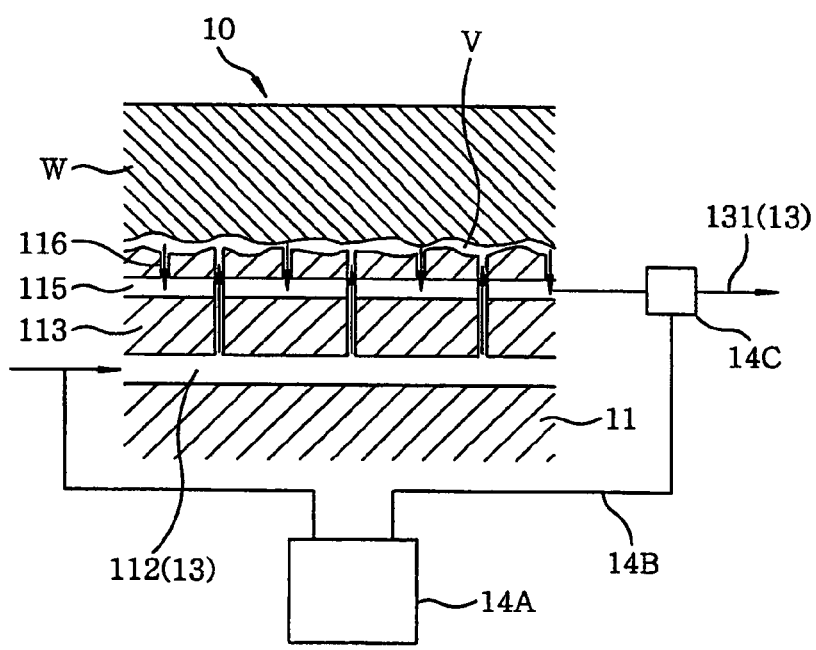
FIG. 2 is an enlarged sectional view for explaining the principle of the substrate supporting unit of the present invention.

Hereinafter, preferred embodiments of the present invention will be described in detail with reference to FIGS. 1 to 6. FIGS. 1 and 2 are schematic diagrams showing the principle of the present invention.

A substrate supporting unit in accordance with the present invention will now be described with reference to the principle diagram shown in FIGS. 1 and 2. The substrate supporting unit 10, as shown in FIGS. 1 and 2, includes a supporter 11 for supporting thereon a substrate (e.g., wafer) W, a temperature controller 12 for controlling a temperature of the supporter 11, and a vacuum adsorption mechanism 13 for adsorptively holding the wafer W on the top surface of the supporter 11 (see FIG. 2). The wafer W is held on the top surface of the supporter 11 by the vacuum adsorption mechanism 13 and the temperature of the wafer W on the supporter 11 is controlled by the temperature controller 12.

The bottom surface of the wafer W and the top surface of the supporter 11 are both mirror-likely finished. However, when microscopically observed, the bottom surface of the wafer W and the top surface of the supporter 11 have irregularities as shown in FIG. 2. As a result, even though the wafer W is vacuum-adsorbed on the top surface of the supporter 11, there remain irregular fine voids V as shown in FIG. 2 and the voids V are depressurized by the vacuum adsorption, thus significantly deteriorating the heat transfer efficiency between the wafer W and the supporter 11. Accordingly, in this embodiment, in order to increase the cooling efficiency of the temperature controller 12, there is provided a heat transfer liquid supplying circuit 14 as a part of the temperature controller 12 as shown in FIGS. 1 and 2. A heat transfer liquid is supplied from the heat transfer liquid supplying circuit 14 into the voids V to be made to infiltrate into the substantially entire area of the wafer W and the top surface of the supporter 11 in a short time; and, therefore, the heat transfer efficiency therebetween is considerably increased, thereby making it possible to promptly control the temperature of the wafer W by using the temperature controller 12.

As shown in FIG. 1, the temperature controller 12 includes a cooling circuit 121 along which a cooling liquid is circulated to cool the supporter 11, and a heater 122 for heating the supporter 11, so that the temperature of the supporter 11 can be controlled to a predetermined level by the temperature controller 12.

As shown in FIG. 1, the cooling circuit 121 includes a liquid tank 121A for storing the cooling liquid, a first liquid passageway 111 formed in the supporter 11 and a circulating line 121B connecting the liquid tank 121A to the first liquid passageway 111 in the supporter 11. The cooling liquid is circulated between the liquid tank 121A and the first liquid passageway 111 in the supporter 11 to cool the supporter 11. Further, the heat transfer liquid supplying circuit 14 includes a liquid tank 14A for containing a heat transfer liquid, a second liquid passageway 112 formed in the supporter 11 near the top surface thereof and a circulating line 14B connecting the liquid tank 14A to the second liquid passageway 112 in the supporter 11. The heat transfer liquid supplying circuit 14 serves to supply the heat transfer liquid into a space formed between the wafer W and the supporter 11 through a plurality of openings 113 extending from the second liquid passageway 112 to be opened at the top surface of the supporter while the vacuum adsorption mechanism 13 is actuated. The heat transfer liquid supplied between the wafer W and the supporter 11 through the second liquid passageway 112 spreads via the voids V throughout the substantially entire surface area of the wafer W, so that the voids V is filled with the heat transfer liquid. In this way, the heat transfer efficiency between the wafer W and the supporter 11 can be significantly increased.

The cooling liquid can cool the supporter down to minus several tens of degrees and, for example, a fluorine-based nonreactive liquid (Fluorinert™ made by Sumitomo 3M Limited, Galden™ made by Solvay Solexis, Inc. and the like) may be used as the cooling liquid. Further, the nonreactive liquid for the cooling liquid may also be used as the heat transfer liquid. In this embodiment, as the cooling liquid and the heat transfer liquid, Fluorinert™ is used. If a same liquid is used for the cooling liquid as well as the heat transfer liquid, a storage and management thereof becomes easy. The cooling liquid and the heat transfer liquid are not limited to the above, and may be selected from conventional cooling liquids.

As shown in FIG. 2, the vacuum adsorption mechanism 13 includes a plurality of vacuum adsorption grooves (not shown) concentrically formed on the top surface of the supporter 11, an exhaust passage 115 formed in the supporter 11 adjacent to the top surface thereof, and a vacuum exhaust unit (not shown) connected to the exhaust passage 115 via an exhaust line 131. The vacuum adsorption mechanism 13 serves to adsorb the wafer W onto the top surface of the supporter 11 through a plurality of openings 116 extending from the exhaust passage 115 to be opened at the vacuum adsorption grooves. Further, the openings 113 of the liquid passageway 112 of the heat transfer liquid supplying circuit 14 are opened at the top surface of the supporter 11 between the adjacent vacuum adsorption grooves, respectively. The exhaust passage 115 is formed close to the top surface above the second liquid passageway 112 as shown in FIG. 2. The exhaust passage 115 and the first and the second liquid passageway 111, 112 are all formed in a base material (top plate) of the supporter 11.

Accordingly, if the heat transfer liquid is supplied from the heat transfer liquid supplying circuit 14 into the voids V between the wafer and the supporter 11 while the vacuum adsorption mechanism 13 is actuated, the heat transfer liquid rapidly spreads throughout the substantially entire area of the voids V due to the suction from the vacuum adsorption grooves to be discharged, through the openings 116 in the vacuum adsorption grooves and the exhaust line 131, to the outside of the supporter 11. The heat transfer liquid is separated from an exhausted air at a separation tank 14C disposed on the exhaust line 131 extending to the vacuum exhaust unit to be finally returned to the liquid tank 14A via the circulating line 14B to be circulated along the liquid passageway 112 in the supporter 11. That is, the vacuum adsorption grooves and the openings 116 thereof serve also as the exhaust grooves and the exhaust openings for the heat transfer openings.

As described above, in this embodiment, when the heat transfer liquid is supplied from the heat transfer liquid supply circuit 14 of the temperature controller 12 to fill the voids between the wafer W and the supporter 11, the heat transfer liquid rapidly spreads into the voids V between the wafer W and the supporter 11 due to the suction of the vacuum adsorption mechanism 13 to form a liquid film in a short time. Accordingly, the cooling efficiency of the cooling circuit 121 becomes significantly increased, so that the temperature of the wafer W can be promptly and accurately controlled to be set at a predetermined level. The heat transfer liquid spread in the voids V can be effectively retrieved through the vacuum adsorption grooves into the liquid tank 14A to be circulated in the supporter 11.

Figure 3:
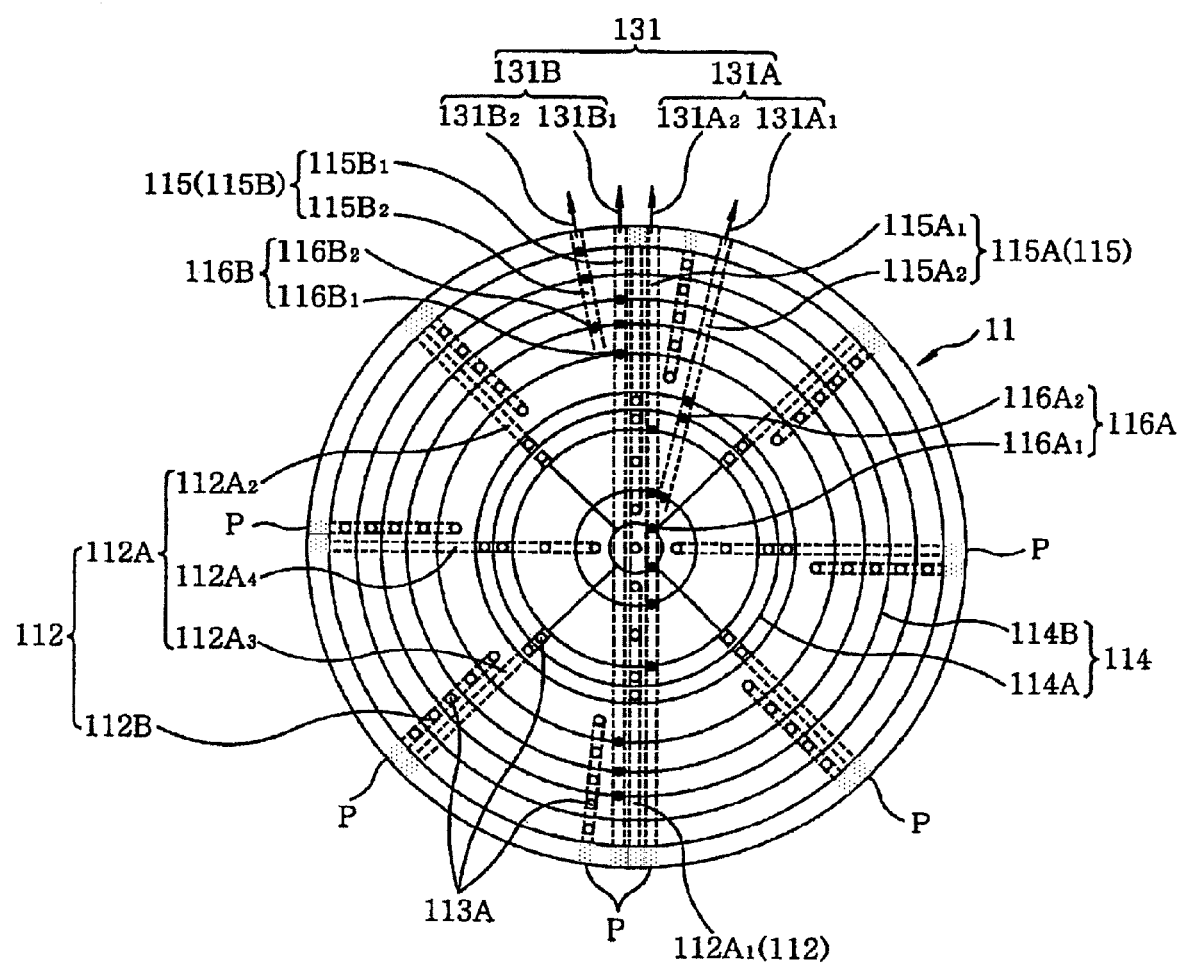
FIG. 3 is a top view of a supporter of a substrate supporting unit in accordance with a preferred embodiment of the present invention.
Figure 4:
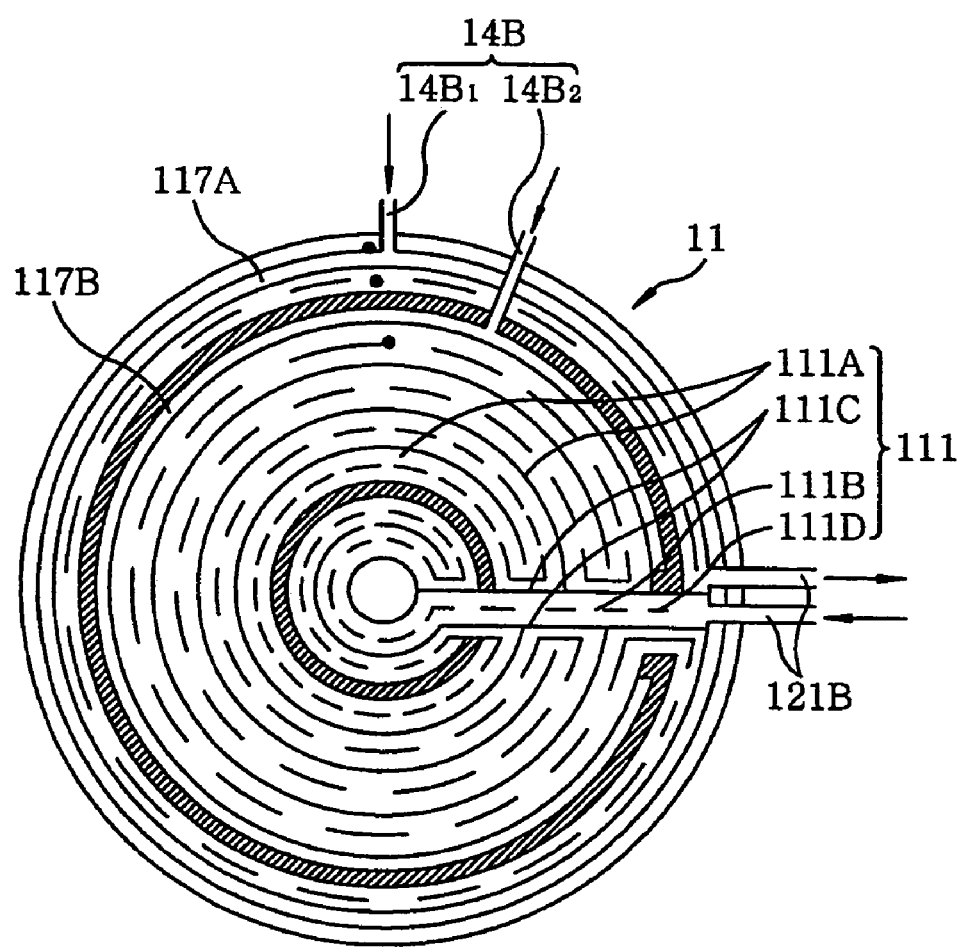
FIG. 4 is a top view showing liquid passageways for a cooling liquid and a heat transfer liquid in the supporter in FIG. 3.
Figure 5:
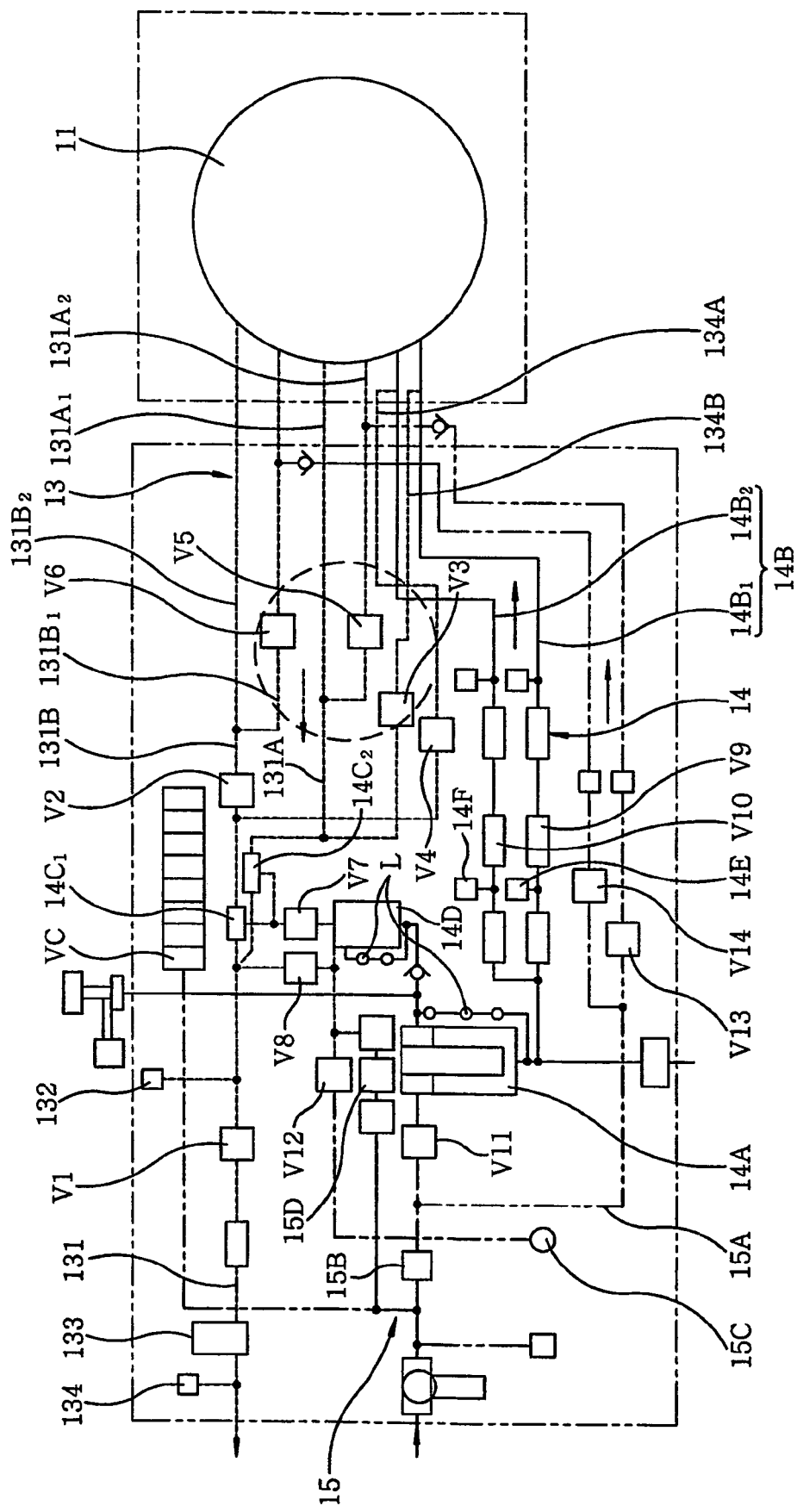
FIG. 5 is a block diagram depicting a substrate temperature controller in accordance with the preferred embodiment of the present invention.
Figure 6:
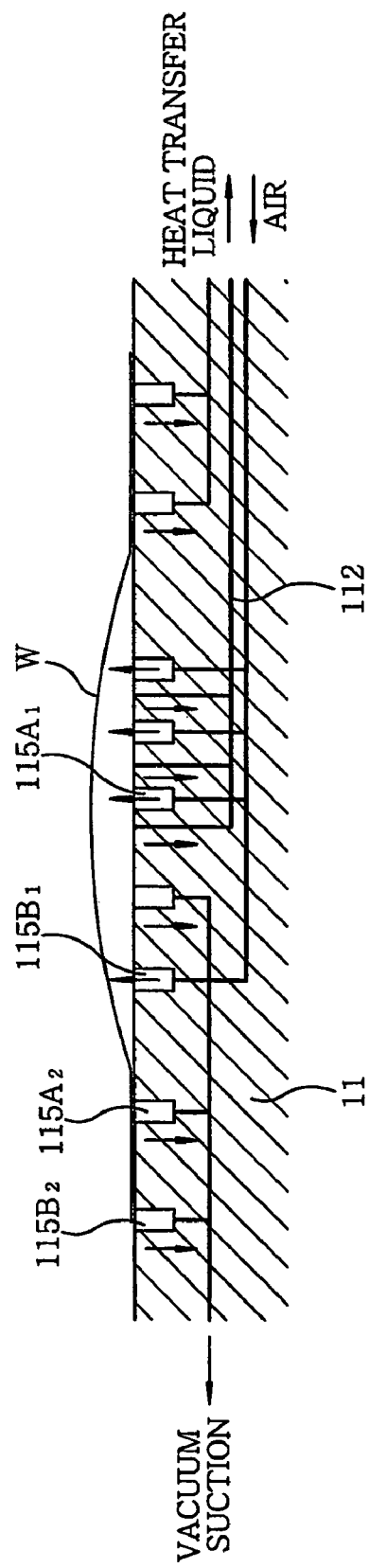
FIG. 6 is a schematic cross-sectional view for explaining an unloading state of the wafer from the supporter.

Hereinafter, there will be described a substrate supporting unit in accordance with a preferred embodiment of the present invention, to which the above principle is applied, with reference to FIGS. 3 to 6. The substrate supporting unit is employed as a wafer chuck of a probing apparatus. Further, FIG. 3 is a schematic top view showing the top surface of a supporter of the substrate supporting unit in accordance with the preferred embodiment of the present invention; FIG. 4 is a schematic top view showing liquid passageways for a cooling liquid and a heat transfer liquid in the supporter shown in FIG. 3; FIG. 5 is a block diagram showing a substrate temperature controller in accordance with the preferred embodiment of the present invention; and FIG. 6 is a schematic view for explaining an unloading process of a wafer from the substrate supporting unit.

As shown in FIGS. 3 to 5, the substrate supporting unit 10 in accordance with the preferred embodiment includes the supporter 11, the temperature controller 12, a vacuum adsorption mechanism 13 and a heat transfer liquid supplying circuit 14, and is configured to accommodate a 200 mm wafer W and a 300 mm wafer W.

Further, as shown in FIGS. 3 to 5, the substrate temperature controller includes a cooling circuit 121 and the heat transfer liquid supplying circuit 14 and is configured based on the aforementioned principle. Referring to FIG. 4, the cooling circuit 121 includes a first liquid passageway 111 formed in the supporter 11 and a circulating line 121B connected to the first liquid passageway 111 in the supporter 11 and serves to cool the supporter 11 by circulating the cooling liquid between a liquid tank (not shown) and the first liquid passageway 11. The heat transfer supplying circuit 14 includes a liquid tank 14A, a second liquid passageway 112 formed in the supporter 11 and a circulating line 14B connecting the liquid tank 14A to the second liquid passageway 112 in the supporter 11 as shown in FIGS. 1, 3 and 5. The heat transfer liquid supplying circuit 14 serves to circulate the heat transfer liquid between the wafer W and the supporter 11 through the circulating line 14B from the liquid tank 14A to thereby increase the heat transfer efficiency therebetween. Further, as shown in FIG. 3, the vacuum adsorption mechanism 13 includes vacuum adsorption grooves 114 formed on the top surface of the supporter 11 and an exhaust passage 115, and serves to adsorptively hold the wafer W through depressurizing the vacuum adsorption grooves 114 with a vacuum exhaust unit (not shown). There will now be described the first and the second liquid passageway 111, 112, the vacuum adsorption groove 114 and the exhaust passage 115.

The first liquid passageway 111 is formed at a backside of a top plate of the supporter 11 shown in FIG. 3. In other words, as shown in FIG. 4, the first liquid passageway 111 is defined by a plurality of partitions 111A which are concentrically arranged. Further, the inner end of a cooling liquid feed passageway 111B is connected to the partition 111A located at the central portion of the first liquid passageway 111. The cooling liquid feed passageway 111B is defined by a pair of secondary partitions 111C which extend radially from the peripheral surface of the supporter 11 through the partitions 111A to the innermost two partitions 111A, respectively. The circulating line 121B extending from a cooling liquid tank (not shown) is connected to the outer end of the cooling liquid feed passageway 111B. The backside of the top plate is sealed with a specified circular plate (not shown) to form the first liquid passageway 111 having a rectangular shape in section.

The secondary partitions 111C extend through the concentric partitions 111A, and there are predetermined gaps between the secondary partitions 111C and one ends of the respective concentric partitions 111A. The gaps serve as turning points such that the cooling liquid flows through the first liquid passageway 111 alternately clockwise and counterclockwise to be discharged to the outside of the supporter 11. Further, the outermost partition 111A of the first liquid passageway 111 has a discharge port to which the circulating line 121B for the cooling liquid is connected.

Baffle plates 111D are disposed at regular intervals along substantially central lines between the adjacent partitions 111A and also between the pair of secondary partitions 111C. The baffle plates 111D force the flow of the cooling liquid to become turbulent to thereby help to make the temperature thereof uniform.

As shown in FIG. 3, the second liquid passageway 112 is formed in two groups, one group including seven liquid passageways 112A adapted to supply the heat transfer liquid to, e.g., the 200 mm wafer W and the other group including eight liquid passageways 112B adapted to supply the heat transfer liquid to, e.g., the 300 mm wafer W. The second liquid passageway 112 is formed between the top surface of the supporter 11 and the first liquid passageway 111. As will be described later, in FIG. 3, ● denotes suction openings used in vacuum-adsorbing the wafer W and ○ indicates liquid supply openings through which the heat transfer liquid is supplied. Moreover, the openings denoted by ● also serve as liquid discharge openings through which the heat transfer liquid supplied through the liquid supply openings indicated by ○ is discharged.

As shown in FIG. 3, one group of liquid passageways 112A includes a liquid passageway $112A_1$ diametically extending through the center of the supporter 11, both ends thereof being clogged with a plug P; and three pairs of liquid passageways $112A_2$, $112A_3$ and $112A_4$ circumferentially arranged apart from each other by 45° on both sides of the liquid passageway $112A_1$, each pair of liquid passageway $112A_2$, $112A_3$ and $112A_4$ radially extending from a location near the center of the supporter 11 to the peripheral surface thereof in a symmetric relationship with respect to the center. These liquid passageways $112A_1$, $112A_2$, $112A_3$ and $112A_4$ communicate via a plurality of communication holes (not shown) with a ring-shaped liquid supply channel 117A (see FIG. 4) formed below them in parallel with the first liquid passageway 111 for the cooling liquid, so that the heat transfer liquid is supplied from the liquid supply channel 117A thereinto. Each of the liquid passageways $112A_1$, $112A_2$, $112A_3$ and $112A_4$ has plural holes 113A opened on the top surface of the supporter at the middle positions between the adjacent vacuum adsorption grooves for the 200 mm wafer which will be described later, so that the heat transfer liquid is supplied to the substantially entire surface of the 200 mm wafer W. Connected to the liquid supply channel 117A is a circulating line $14B_1$ for supplying the heat transfer liquid.

As shown in FIG. 3, the other group includes eight liquid passageways 112B which are disposed at locations slightly offset in the clockwise direction from the corresponding liquid passageways $112A_1$, $112A_2$, $112A_3$ and $112A_4$ in parallel therewith. The liquid passageways 112B are symmetrically arranged with respect to the center of the supporter 11. The liquid passageways 112B communicate via a plurality of communication holes (not shown) with a ring-shaped liquid supply channel 117B (see FIG. 4) formed below them and outside the first liquid passageway 111 for the cooling liquid in parallel therewith, so that the heat transfer liquid is supplied from the liquid supply channel 117B thereinto. Each of the liquid passageways 112B has plural holes 113A opened on the top surface of the supporter 11 at the middle positions between the adjacent vacuum adsorption grooves for 300 mm wafer which will be described later, so that the heat transfer liquid is supplied to the substantially entire surface of the 300 mm wafer W. Connected to the liquid supply channel 117B is a circulating line $14B_2$ for supplying the heat transfer liquid.

Referring to FIG. 3, the vacuum adsorption grooves 114 included in the vacuum adsorption mechanism 131 are concentrically formed in plural on the top surface of the supporter 11. The vacuum adsorption grooves 114 includes a plurality of first vacuum adsorption grooves 114A formed on a central portion of the top surface of the supporter 11 to correspond to the 200 mm wafer W and a plurality of second vacuum adsorption grooves 114B formed at the outside of the first vacuum adsorption grooves 114A to correspond to the 300 mm wafer W. There are formed, immediately under the top surface of the supporter 11, a first and a second exhaust passage 115A and 115B corresponding to the first and the second vacuum adsorption grooves. A first and a second exhaust line 131A and 131B (see FIG. 5) are respectively connected to the first and the second exhaust passage 115A and 115B, and the exhaust lines 131A, 131B are also connected to a vacuum exhaust unit (not shown). The first and the second exhaust line 131A and 131B are described in detail later together with the temperature controller 12.

The first exhaust passage 115A includes two exhaust passages $115A_1$ and $115A_2$, as shown in FIG. 3. One exhaust passage $115A_1$ linearly extends through the supporter 11 from a peripheral portion (upper peripheral portion in FIG. 3) thereof at the right side of the liquid passageway $112A_1$ in parallel therewith. One end of the exhaust passage $115A_1$ is connected to the vacuum exhaust line 131 and the other end thereof is clogged with a plug P. The exhaust passage $115A_1$ has plural openings $116A_1$ at locations intersecting with the first vacuum adsorption grooves 114A which are located at the inner side. The openings $116A_1$ and the first vacuum adsorption grooves 114A communicating therewith also serve as discharge openings and grooves for the heat transfer liquid, respectively. The other exhaust passage $115A_2$ slantly extends toward the center of the supporter 11 at the right side of the exhaust passage $115A_1$. The exhaust passage $115A_2$ extends from a peripheral portion to the first vacuum adsorption groove 114A next to the innermost one, and has plural openings $116A_2$ at locations intersecting with the first vacuum adsorption grooves 114A. The openings $116A_2$ and the vacuum adsorption grooves 114A communicating therewith also serve as discharge openings and grooves for the heat transfer liquid, respectively.

As similarly to the first exhaust passage 115A, the second exhaust passage 115B includes two exhaust passages $115B_1$ and $115B_2$. As shown in FIG. 3, one exhaust passage $115B_1$ linearly extends through at the left side of the liquid passageway $112A_1$ in parallel therewith from a peripheral portion (upper peripheral portion in FIG. 3) of the supporter 11. One end of the exhaust passage $115B_1$ is connected to the vacuum exhaust line 131 and the other end thereof is clogged with a plug P. The exhaust passage $115B_1$ also has plural openings $116B_1$ at locations intersecting with the second vacuum adsorption grooves 114B which are located at the inner side thereof. The openings $116A_1$ and the vacuum adsorption grooves 114B communicating therewith also serve as discharge opening and grooves for the heat transfer liquid, respectively. The other exhaust passage $115B_2$ slantly extends toward the center of the supporter 11 at the left side of the exhaust passage $115B_1$. The exhaust passage $115B_2$ extends from a peripheral portion to the second vacuum adsorption groove 114B next to the innermost one, and has plural openings $116A_2$ at locations intersecting with the second vacuum adsorption grooves 114B. The openings $116B_2$ and the vacuum adsorption grooves 114B communicating therewith also serve as discharge openings and grooves for the heat transfer liquid, respectively.

Furthermore, the first and the second exhaust passage 115A and 115B are connected to the vacuum exhaust unit (not shown) via the first and the second exhaust line 131A and 131B, respectively. Since the first exhaust passage 115A is comprised of the exhaust passages $115A_1$ and $115A_2$, the first exhaust line 131A connecting them to the vacuum exhaust unit is also divided into branch lines $131A_1$ and $131A_2$ at a location near the supporter 11. For the same reason, the second exhaust line 131B is also divided into branch lines $131B_1$ and $131B_2$ at a location near the supporter 11.

Hereinafter, there will be described a circuit configuration of the vacuum adsorption mechanism 13 and the heat transfer liquid supply circuit 14 of the substrate temperature control unit with reference to FIG. 5. The substrate temperature control unit includes an air circuit 15 in addition to the heat transfer liquid supply circuit 14. The air circuit 15 facilitates the supplying of the heat transfer liquid by the heat transfer liquid supply circuit 14 and the discharging of the heat transfer liquid after the processing of the wafer W. The heat transfer liquid supply circuit 14 is operated under the control of the vacuum adsorption mechanism 13. Therefore, the vacuum adsorption mechanism 13 will be first described. Further, in FIG. 5, the broken line indicates suction exhaust lines, the solid line denotes heat transfer liquid lines, and the dashed double-dotted line presents air lines. In valves V1 to V14 installed on the lines, each of the valves V1 to V8 is a normal open type (NO) and each of the other valves is a normal close type (NC).

Attached to the first and the second exhaust line 131A and 131B of the vacuum adsorption mechanism 13 are separation tanks $14C_1$ and $14C_2$ for separating the heat transfer liquid discharged from the supporter 11, respectively. The first and the second exhaust line 131A and 131B are joined together to form the exhaust line 131 where the heat transfer liquid is not present since it has already been separated therefrom. The valve V1 installed on the exhaust line 131 controls ON/OFF of the vacuum suction. A pressure sensor 132 and a vacuum control circuit 133 are provided at an upstream and a downstream side of the valve V, respectively. The vacuum control circuit 133 controls the vacuum pressure in the exhaust line 131 based on a value detected by the pressure sensor 132. Further, the valve V2 is installed on the second exhaust line 131B, which is used in processing the 300 mm wafer W. Moreover, the first and the second exhaust line 131A and 131B are connected to the circulating lines $14B_1$ and $14B_2$ for the heat transfer liquid via connection lines 134A and 134B to which the valves V3 and V4 are provided, respectively. The valves V3, V4 are opened while the wafer W is unloaded, so that the first and the second exhaust line 131A and 131B communicate with the circulating lines $14B_1$ and $14B_2$ to discharge the heat transfer liquid. Further, among the branch lines of the first and the second exhaust line 131A and 131B, the branch lines $131A_2$ and $131B_1$ for discharging the heat transfer liquid have the valves V5 and V6, respectively. The valves V5 and V6 are closed and the branch lines $131A_2$ and $131B_1$ are connected to the air lines during the unloading of the wafer W, so that air is supplied into the supporter 11, thereby discharging the heat transfer liquid therein.

The separation tank $14C_1$ and $14C_2$ included in the heat transfer liquid supply circuit 14 are connected to the liquid collection tank 14D via the respective circulating lines, so that the heat transfer liquid separated at the separation tanks $14C_1$, $14C_2$ is retrieved and collected in the liquid collection tank 14D. The valves V7 and V8 are provided between the separation tanks $14C_1$, $14C_2$ and the liquid collection tank 14D and between the exhaust line 131 and the liquid collection tank 14D, respectively. The valves V7 and V8 are closed while the heat transfer liquid is moved from the liquid collection tank 14D to the liquid tank 14A, thereby isolating the first and the second exhaust line 131A, 131B from the liquid collection tank 14D to maintain the vacuum state therein. Meanwhile, the valves V7 and V8 are opened while the heat transfer liquid is circulated, so that the heat transfer liquid is dropped from the separation tanks $14C_1$, $14C_2$ into the separation tank 14D by its weight. A liquid level sensor L is installed at the liquid collection tank 14D to monitor the amount of the liquid collected therein. The liquid level sensor L is actuated when the amount of the collected liquid reaches a predetermine level, and the valve V12 is opened while the valves V7 and V8 are closed to allow the air to press the upper side of the collected liquid at a preset pressure, so that the heat transfer liquid is returned from the liquid collection tank 14D to the liquid tank 14A. The liquid tank 14A is connected to the supporter 11 via the circulating lines $14B_1$ and $14B_2$ on which the valves V9 and V10 are provided, respectively. Pressure sensors 14E and 14F are provided at the upstream and the downstream side of the respective valves V9 and V10 to monitor the clogging of filters disposed before and after the valves V9 and V10.

The air circuit 15 is used while the heat transfer liquid is supplied from the liquid tank 14A to the supporter 11 and/or the wafer W is unloaded. The air circuit 15 includes an air line 15A, an air control circuit 15B, a pressure sensor 15C and an ejector 15D. The air line 15A is connected to the liquid tank 14A, the liquid collection tank 14D and the first and the second exhaust line 131A, 131B of the vacuum adsorption mechanism 13 and the valves V11 to V14 are provided on the air circuit 15. The valves V13, V14 are interlocked with the valves V5 and V6 provided on the branch lines 131A$_2$ and 131B$_1$ serving as the discharging lines for the heat transfer liquid while the wafer W is loaded to thereby facilitate the discharge of the heat transfer liquid from the supporter 11. Specifically, the valves V13, V14 are opened while the valves V5, V6 are closed, so that an air of a preset pressure is fed into the supporter 11 to force the heat transfer liquid in the supporter 11 to be discharged. The discharged heat transfer liquid flows through the respective branch lines 131A$_1$, 131B$_2$ of the first and the second exhaust line 131A, 131B. The ejector 15D is used in restoring the liquid collection tank 14D to a depressurized ambience after the heat transfer liquid is moved from the liquid collection tank 14D to the liquid tank 14A. Further, in FIG. 5, reference numeral VC represents a control unit for sequentially controlling the valves V1 to V14.

There will now be described the operation in case of the 300 mm wafer W mounted on the substrate supporting unit 10. First, there will be described the substrate supporting unit 10 when a probing is performed thereon at a temperature ranging from an ambient temperature to a high temperature. The supporter 11 is cooled in advance by using the cooling circuit 121 of the temperature controller 12. Under such state, the wafer W is mounted on the supporter 11, and the vacuum exhaust unit 13 is actuated and the valves V1, V2 are opened, so that the gap between the wafer W and the supporter 11 is depressurized through the exhaust passages 115A$_1$, 115A$_2$ of the first exhaust passageway 115A and the exhaust passage 115B$_1$, 115B$_2$ of the second exhaust passageway 115B, thereby adsorptively holding the wafer W.

Subsequently, the valves V9, V10 are opened to allow the liquid tank 14A to communicate with the supporter 11 via the circulating lines 14B$_1$, 14B$_2$. Under such state, the valve V11 is opened and the air control circuit 15B supplies a pressurized air to the liquid tank 14A to press the heat transfer liquid therein, thereby facilitating the supply of the heat transfer liquid into the supporter 11 by synergy with the suction of the vacuum adsorption mechanism 13. That is, the heat transfer liquid is forced to be discharged from the tank 14A and flows through the circulating lines 14B$_1$, 14B$_2$ into the liquid supply channels 117A, 117B of the supporter 11. The heat transfer liquid is introduced into the second liquid passageway 112 through the communication holes of the liquid supply channels 117A, 117B and then divided into the liquid passageways 112A, 112B to infiltrate into the fine voids between the wafer W and the supporter 11 throughout the substantially entire area thereof from the openings 113A of the liquid passageways 112A, 112B. At this time, due to the suction of the vacuum adsorption mechanism 13 through the vacuum adsorption grooves 114 and the openings 113a located at the middle portions between the adjacent concentric vacuum adsorption grooves 114, the heat transfer liquid supplied from the openings 113a rapidly infiltrates into and diffuses throughout the fine voids between the wafer W and the supporter 11.

Then, the heat transfer liquid infiltrated into the fine voids between the wafer W and the supporter 11 flows into the vacuum adsorption grooves 114 to be discharged through the openings 116A, 116B formed in the vacuum adsorption grooves 114 through the first and the second exhaust passage 115A, 115B to the outside of the supporter 11, respectively. Thereafter, the heat transfer liquid flows through the first and the second exhaust line 131A, 131B into the separation tanks 14C$_1$, 14C$_2$, respectively. The heat transfer liquid is separated from the suction air by its weight at the separation tanks 14C$_1$, 14C$_2$, so that only the air flowing through the first and the second exhaust line 131A, 131B joins together in the exhaust line 131 to be discharged.

After the heat transfer liquid is infiltrated throughout the substantially entire area of the fine voids between the wafer W and the supporter 11, the heat transfer liquid is circulated under the condition that the air pressure is decreased by using the air control circuit 15B and the vacuum level is lowered by using the vacuum control circuit 133. While the heat transfer liquid is being circulated, the wafer w is aligned on the supporter 11. In case there is used as the heat transfer liquid Fluorinert™ which is likely to evaporate, the consumption of the heat transfer liquid can be reduced by supplying it under a lower vacuum level. The evaporation amount of the heat transfer liquid may be decreased by lowering the air pressure to reduce the amount of the circulated liquid. Under such conditions, the wafer W is inspected while the heat transfer liquid is circulated.

The heat transfer liquid rapidly infiltrates throughout the substantially entire area of the wafer W and the supporter 11 to fill the fine voids therebetween, so that the heat transfer efficiency between the wafer W and the supporter 11 can be considerably increased. Accordingly, the cooling efficiency by the cooling circuit 121 becomes significantly increased, so that the wafer W can be efficiently cooled. To that end, even though a large amount of heat is generated from the wafer upon inspection thereof, the wafer W can be controlled to a desired temperature by efficiently cooling the wafer W, thereby resulting in a highly reliable inspection therefor.

When the liquid level in the liquid collection tank 14D reaches an upper limit value, the liquid level sensor L detects it. In response to the signal from the liquid level sensor L, an action starts to be taken to move the heat transfer liquid in the liquid collection tank 14D into the liquid tank 14A. Specifically, for the movement of the liquid, the valves V7, V8 are closed and the valve 12 is opened to increase the pressure in the liquid collection tank 14D, so that the heat transfer liquid starts to move into the liquid tank 14A. When the liquid level sensor L detects a lower limit value to stop the movement of the liquid, the valve V12 is closed. Subsequently, the liquid collection tank 14D is vacuum-exhausted by using the ejector 15D to adjust the vacuum level therein to that in the first and the second exhaust line 131A, 131B and the valves V7, V8 are then opened. Thereafter, the ejector 15D is halted and the heat transfer liquid is again circulated.

The wafer W is unloaded after completion of the inspection therefor. At this time, the valves V9, V10 of the circulating lines 14B$_1$, 14B$_2$ for supplying the heat transfer liquid are closed while the valves V2, V3 and V4 of the first and the second exhaust line 131A, 131B are opened instead thereof and the valves V5, V6 thereof are closed while the valves V13, V14 of the air line 15A are opened instead thereof. In this way, as shown in FIG. 6, the air in the voids between the wafer W and the supporter 11 is suctioned through the exhaust passages 115A$_2$, 115B$_2$ in the supporter 11 to vacuum-adsorb the peripheral portion of the wafer W and, at the same time, the air is supplied to the central portion of the wafer W from the exhaust passage 115A$_1$, 115B$_1$, so that the second liquid passageway 112 in the supporter 11 is converted into the exhaust lines 131A$_1$, 131B$_2$ serving as the vacuum lines. Accordingly, the heat transfer liquid can be smoothly removed through the second liquid passageway 112 from the voids between the wafer W and the supporter 11 under the condition that the central portion of the wafer W is made to float.

As described above, in this embodiment, when controlling the temperature of the wafer W on the supporter 11, there are provided the processes of controlling the temperature of the supporter 11 by using the temperature controller 12, mounting the wafer W on the supporter 11, supplying the heat transfer liquid through the openings 113A opened at the top surface of the supporter 11, and exhausting the heat transfer liquid through the vacuum adsorption grooves 114 located near the openings 113A and the openings 116A, 116B opened therein by using the vacuum adsorption mechanism 14. Accordingly, the heat transfer liquid can be made to rapidly infiltrate into the fine voids between the wafer W and the supporter 11 to increase the heat transfer efficiency between the wafer W and the supporter 11 therethrough. Further, the heat transfer liquid can be smoothly circulated through the voids, which significantly increases the cooling efficiency by the cooling circuit 121.

Furthermore, in accordance with this embodiment, since the liquid tank 14A is pressed when the heat transfer liquid is supplied therefrom to the openings 113A, the circulation of the heat transfer liquid can be smoothly conducted to increase the cooling efficiency. Besides, the heat transfer liquid is collected in the liquid collection tank 14D and then the collected heat transfer liquid is moved into the liquid tank 14A, so that the heat transfer liquid retrieved from the supporter 11 can be successively and surely circulated. In addition, since the inside of the liquid collection tank 14D is depressurized after the heat transfer liquid is moved to the liquid tank 14A therefrom, the liquid collection tank 14D can be smoothly connected to the first and the second exhaust line 131A, 131B on the vacuum side. When the wafer W is removed from the supporter 11, by removing the heat transfer liquid between the wafer W and the supporter 11, there are formed voids therebetween such that the wafer W can be smoothly unloaded without being damaged. Moreover, since the air is supplied between the wafer W and the supporter 11 when the heat transfer liquid is removed, the heat transfer liquid can be rapidly removed.

Although there has been described the case where the wafer W is handled at an ambient temperature and a high temperature in the above embodiment, there will now be described a case where the wafer W is handled at a low temperature, for example, a case where the wafer W is inspected at −65° C. Since the viscosity of the heat transfer liquid becomes great at the above temperature, the heat transfer liquid cannot be smoothly supplied between the wafer W and the supporter 11 by using the method of the above embodiment. Accordingly, in this embodiment, the air and the heat transfer liquid is forcedly supplied to the central portion of the wafer W to make the central portion of the wafer W be floated, thereby facilitating the infiltration of the heat transfer liquid. In this embodiment, the 200 mm wafer W is used.

The wafer W is mounted on the supporter 11, and the valve V1 is opened to vacuum-adsorb the wafer W. Subsequently, the valves V9, V11 are opened to supply the heat transfer liquid from the liquid tank 14A to the supporter 11. Under such state, observation thereon is made for several tens of seconds. Then, in a few seconds after the air pressure is decreased, the valve V13 is opened while the valve V5 is closed and the air is forcedly introduced between the wafer W and the supporter 11 to break the vacuum state. Thereafter, while the valves V13, V9 are closed, the valves V5 and V3 are opened to depressurize the circulating line 14$B_1$. Subsequently, the valves V3 and V5 are closed and the valve V5 is opened to forcedly flow the air between the wafer W and the supporter 11 to break the vacuum state. After keeping such state for a while, the air pressure is decreased under such state. After a few seconds, all valves other than the valves V1, V5 and V11 are closed, and the air pressure in the liquid tank 14A is increased and the gap between the wafer W and the supporter 11 is made in a vacuum state. After maintaining such state for about 10 seconds, the valve V9 is opened to supply the heat transfer liquid from the liquid tank 14A to the supporter 11.

With a series of processes as described above, the heat transfer liquid infiltrates throughout the substantially entire surface of the wafer W. Thereafter, the heat transfer liquid is circulated under the condition that the air pressure is decreased to a normal operation level. After being aligned, the wafer W is inspected.

In accordance with this embodiment, under a low temperature condition that the viscosity of the heat transfer becomes great, by flowing the air and the heat transfer liquid together to the central portion of the wafer W to forcedly supply the heat transfer liquid between the wafer W and the supporter 11, the heat transfer liquid can be made to infiltrate therebetween in a relatively short time, thereby increasing the throughput.

While the invention has been shown and described with respect to the preferred embodiments, it will be understood by those skilled in the art that various changes and modifications may be made without departing from the spirit and scope of the invention as defined in the following claims.

What is claimed is:

1. A substrate supporting unit, comprising:
    a supporter for supporting a substrate; and
    a temperature controller for controlling a temperature of the supporter, wherein the supporter includes:
    one or more liquid supply openings opened at a top surface of the supporter, liquid being supplied between the substrate and the supporter through the liquid supply openings;
    one or more liquid discharge grooves formed in the top surface of the supporter near the liquid supply openings, the liquid between the substrate and the supporter being discharged through the liquid discharge grooves; and
    one or more liquid discharge openings opened in the liquid discharge grooves, the liquid being discharged through the liquid discharge openings,
    wherein the supporter includes one or more exhaust grooves, formed in the top surface of the supporter, for attaching the substrate onto the top surface of the supporter; and one or more exhaust openings opened in the exhaust grooves, the exhaust grooves and the exhaust openings serving as the liquid discharge grooves and the liquid discharge openings, respectively, and
    wherein the liquid supply openings are opened at the top surface of the supporter and are separate from the liquid discharge grooves.

2. The substrate supporting unit of claim 1, wherein the number of the liquid discharge grooves is two or more, and the liquid discharge grooves are concentrically formed in a circular shape.

3. The substrate supporting unit of claim 2, wherein the supporter is divided into two or more regions, each of the regions has two or more of the liquid discharge grooves, and each of the liquid discharge grooves of each of the regions is separate from each other.

4. The substrate supporting unit of claim 2, wherein each of the liquid supply openings are opened on the top surface of the supporter at a middle portion of two adjacent liquid discharge grooves.

5. The substrate supporting unit of claim 2, wherein the supporter further includes one or more exhaust passages for vacuum exhaust, disposed in the supporter;
    the exhaust passages are disposed in the supporter substantially parallel with the top surface of the supporter; and the liquid discharge openings are formed at locations at which the exhaust passages intersect the liquid discharge grooves.

6. A substrate temperature control apparatus for controlling a temperature of a substrate supported on a supporter, comprising:

the supporter including one or more liquid supply openings opened at a top surface of the supporter, liquid being supplied between the substrate and the supporter through the liquid supply openings; one or more liquid discharge grooves formed in the top surface of the supporter near the liquid supply openings, the liquid between the substrate and the supporter being discharged through the liquid discharge grooves; and one or more liquid discharge openings opened in the liquid discharge grooves, the liquid being discharged through the liquid discharge openings;

a liquid tank for containing the liquid, the liquid tank being connected to the liquid supply openings; and a liquid collection tank for collecting the liquid, the liquid collection tank being connected to the liquid discharge openings, wherein the liquid existing between the substrate and the supporter serves as a heat transfer medium therebetween, wherein the supporter includes one or more exhaust grooves, formed in the top surface of the supporter, for attaching the substrate onto the top surface of the supporter; and one or more exhaust openings opened in the exhaust grooves, the exhaust grooves and the exhaust openings serving as the liquid discharge grooves and the liquid discharge openings, respectively, and wherein the liquid supply openings are opened at the top surface of the supporter and are separate from the liquid discharge grooves.

7. The substrate temperature control apparatus of claim 6, further comprising an openable/closable valve provided between the liquid collection tank and the liquid discharge openings, wherein the liquid tank supplies the liquid to the liquid supply openings and the liquid collection tank retrieves the liquid from the liquid discharge openings under a depressurized condition.

8. The substrate temperature control apparatus of claim 6, wherein the number of the liquid discharge grooves is two or more, and the liquid discharge grooves are concentrically formed in a circular shape.

9. The substrate temperature control apparatus of claim 8, wherein the supporter is divided into two or more regions, each of the regions has two or more of the liquid discharge grooves, and each of the liquid discharge grooves of each of the regions is separate from each other.

10. The substrate temperature control apparatus of claim 8, wherein each of the liquid supply openings are opened on the top surface of the supporter at a middle portion of two adjacent liquid discharge grooves.

11. The substrate temperature control apparatus of claim 8, wherein the supporter further includes one or more exhaust passages for vacuum exhaust, disposed in the supporter;

the exhaust passages are disposed in the supporter substantially parallel with the top surface of the supporter; and the liquid discharge openings are formed at locations at which the exhaust passages intersect the liquid discharge grooves.

12. A substrate temperature control method for controlling a temperature of a substrate supported on a supporter, comprising the steps of:

controlling a temperature of the supporter;

mounting the substrate on the supporter;

supplying liquid between the supporter and the substrate through one or more liquid supply openings opened at a top surface of the supporter and separate from each of one or more liquid discharge grooves formed in the top surface of the supporter near the liquid supply openings; and discharging the liquid through the liquid discharge grooves from one or more liquid discharge openings opened in the liquid discharge grooves by depressurizing the liquid discharge openings, wherein the supporter includes one or more exhaust grooves, formed in the top surface of the supporter, for attaching the substrate onto the top surface of the supporter; and one or more exhaust openings opened in the exhaust grooves, the exhaust grooves and the exhaust openings serving as the liquid discharge grooves and the liquid discharge openings, respectively.

13. The substrate temperature control method of claim 12, further comprising the step of pressurizing a liquid tank when supplying the liquid from the liquid tank to the liquid supply openings.

14. The substrate temperature control method of claim 13, further comprising the steps of collecting the liquid in a liquid collection tank; and moving the liquid collected in the liquid collection tank to the liquid tank.

15. The substrate temperature control method of claim 14, further comprising the step of depressurizing the liquid collection tank after the liquid is moved from the liquid collection tank to the liquid tank.

* * * * *